United States Patent
Sharma et al.

(10) Patent No.: US 10,797,132 B2
(45) Date of Patent: Oct. 6, 2020

(54) HETEROJUNCTION BIPOLAR TRANSISTOR FABRICATION USING RESIST MASK EDGE EFFECTS

(71) Applicant: Newport Fab, LLC, Newport Beach, CA (US)

(72) Inventors: Santosh Sharma, Rancho Santa Margarita, CA (US); Edward J. Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 124 days.

(21) Appl. No.: 16/023,166

(22) Filed: Jun. 29, 2018

(65) Prior Publication Data

US 2020/0006482 A1    Jan. 2, 2020

(51) Int. Cl.

| H01L 29/08 | (2006.01) |
| H01L 29/737 | (2006.01) |
| H01L 21/265 | (2006.01) |
| H01L 21/266 | (2006.01) |
| H01L 29/66 | (2006.01) |

(52) U.S. Cl.
CPC ........ *H01L 29/0821* (2013.01); *H01L 21/266* (2013.01); *H01L 21/26513* (2013.01); *H01L 29/66242* (2013.01); *H01L 29/7375* (2013.01)

(58) Field of Classification Search
None
See application file for complete search history.

(56) References Cited

U.S. PATENT DOCUMENTS

| 5,321,301 A * | 6/1994 | Sato ............... H01L 29/0826 257/557 |
| 5,336,926 A * | 8/1994 | Matthews ........ H01L 21/8249 438/234 |
| 5,341,022 A * | 8/1994 | Kuroi .............. H01L 21/3221 257/590 |
| 5,424,228 A * | 6/1995 | Imai ............... H01L 29/66287 257/E21.379 |
| 5,643,808 A * | 7/1997 | Suzuki ............. H01L 29/0821 438/370 |

(Continued)

*Primary Examiner* — Lex H Malsawma
(74) *Attorney, Agent, or Firm* — Bever, Hoffman & Harms, LLP

(57) ABSTRACT

A heterojunction bipolar transistor (HBT) is fabricated using a selectively implanted collector (SIC) implant mask including multiple openings located over the HBT's collector region. During the SIC implant process, resist mask edge (well proximity) effects caused by the SIC dopant passing through the multiple openings generates multiple secondary shallow increased-doping regions in the collector region adjacent to the substrate surface, where the mask openings are sized such that each secondary increased-doping region has a doping concentration that is comparable to primary increased-doping regions, which are simultaneously formed deeper in the SIC region. A base structure and an emitter structure are then formed over the SIC region using known techniques. The secondary increased-doping regions produce enhanced base-collector junction between the SIC region and the base structure that measurably decreases Kirk Effect by way of enhancing the HBT's cutoff frequency (Ft) and break-down voltage ($BV_{CEO}$).

12 Claims, 8 Drawing Sheets

(56) References Cited

U.S. PATENT DOCUMENTS

| | | | | |
|---|---|---|---|---|
| 5,982,022 A | * | 11/1999 | Violette | ............. H01L 29/0821 |
| | | | | 257/592 |
| 6,265,275 B1 | * | 7/2001 | Marty | ................ H01L 29/0826 |
| | | | | 257/E21.371 |
| 6,352,901 B1 | * | 3/2002 | Chang | ................ H01L 29/0821 |
| | | | | 257/E21.375 |
| 2003/0227071 A1 | * | 12/2003 | Chen | ................ H01L 29/66242 |
| | | | | 257/592 |

* cited by examiner

HETEROJUNCTION BIPOLAR TRANSISTOR FABRICATION USING RESIST MASK EDGE EFFECTS

FIELD OF THE INVENTION

The present invention is directed to semiconductor devices that utilize analog devices such as bipolar resistors, and more particularly to fabrication methods (flows) utilized to produce semiconductor devices that include one or more Heterojunction Bipolar Transistors (HBTs).

BACKGROUND OF THE INVENTION

A heterojunction bipolar transistor (HBT) is a type of bipolar junction transistor (BJT) that utilizes different semiconductor materials to form the HBT's emitter, collector and base structures, thereby creating a heterojunction (i.e., an interface between two layers or regions of dissimilar crystalline semiconductor materials). HBTs are generally recognized as being capable of transmitting signals having substantially higher frequencies (e.g., up to several hundred GHz) in comparison to standard BJTs, and are therefore utilized in modern ultrafast semiconductor devices (circuits) such as those used in radio-frequency (RF) systems, and in semiconductor devices requiring a high power efficiency such as RF power amplifiers in cellular phones.

As with all integrated circuit elements, there is continuous need for higher performance HBTs that consume less power. A key consideration when scaling HBTs is maintaining or reducing the Kirk Effect, which occurs when an HBT is operating at high current densities, and is due to the charge density associated with the current passing through the base-collector region. The Kirk Effect occurs when the charge density associated with the current through an HBT is larger than the ionized impurity density in the base-collector depletion region. The effective width of the base layer then equals the width of the base and part of the collector layer, which increases the transit time substantially. This base width increase reduces the current gain and the transit frequency. One typical modification that may be implemented to reduce the Kirk Effect is to increase the collector doping concentration. However, increasing the collector doping would also increase the base-collector capacitance and decreases the collector-base breakdown voltage, which would both reduce the resulting HBT's effectiveness for RF applications and limit the maximum voltage that can be applied to the collector of the device. Accordingly, a proper trade-off between these factors is part of any device design and optimization.

What is needed is a scalable fabrication method for producing HBTs that exhibit enhanced operating characteristics (e.g., lower Kirk Effect) while avoiding the high cost and complexity of conventional approaches. What is also needed are HBTs produced in accordance with the fabrication method.

SUMMARY OF THE INVENTION

The present invention is directed to a scalable, low-cost method for fabricating HBTs that utilizes the resist mask edge effect (aka, well proximity effect) during formation of selectively implanted collector (SIC) regions to generating shallow "secondary" increased-doping regions that serve to increase the base-collector capacitance without decreasing the collector-base breakdown voltage. The SIC regions are formed during an SIC implant process during which a selected SIC dopant is implanted and diffused into a semiconductor substrate such that each SIC region extends (i.e., forms a conductive path) between a surface of the substrate and a buried layer region that is at least partially disposed below a collector region. According to an aspect of the present invention, the SIC implant process involves directing the implanted SIC dopant through an SIC implant mask formed by patterning a photoresist layer to include multiple mask openings that expose corresponding upper surface sections over each HBT's designated collector region. When directing the SIC dopant through the mask, first portions of the implanted SIC dopant pass directly through the multiple mask openings and enter the substrate perpendicular to the exposed corresponding surface sections, thereby forming one or more primary increased-doping regions below the substrate surface at a depth determined by the SIC implant process parameters. According to another aspect of the present invention, the multiple mask-opening configuration also causes second portions of the SIC dopant to be subjected to mask edge effects generated by each of the multiple mask openings (e.g., to deflected by side edges of each mask opening toward the center of each mask opening), whereby the second dopant portions are slowed and enter the exposed substrate surface sections at an angle such that they form secondary increased-doping regions in the collector region between primary increased-doping regions and the corresponding substrate surface sections below each mask opening. After the SIC implant process, a base structure is formed on the substrate surface over each SIC region, thereby forming a base-collector junction between the base structure and the SIC region, and then emitter structures are formed on each base structure to complete the HBTs. The secondary increased-doping regions generated by the modified SIC implant process provide each HBT with a collector doping profile characterized by having a higher doping concentration at or just below the base-collector junction than that normally provided at the uppermost portion of conventional SIC regions produced in accordance with normal (single mask) SIC implant techniques. That is, although the doping concentration of the secondary increased-doping regions is typically slightly lower than the doping concentrations of the primary increased-doping regions, it is substantially higher than that generated between the primary increased doping regions and the substrate surface using conventional single-mask-opening techniques in which mask edge effects are minimized. The modified collector doping profiles generated in accordance with the present invention produces HBTs exhibiting improved operating characteristics, such as the key metric of Ft*BVceo (effectively, transistor switching speed multiplied by transistor breakdown), in comparison to HBTs formed with conventional doping profiles produced using single-window implant approaches. Specifically, the inventors believe the improved Ft*BVceo metric of HBTs produced in accordance with the present invention is due to a focusing effect of the implanted ions scattered from the resist edge which results in a tighter, less laterally spread final profile than a traditionally implanted profile device. Moreover, because the entire SIC region is formed using a single implant process (i.e., such that both the primary and secondary increased-doping regions are formed simultaneously), the present invention facilitates the production of enhanced HBTs without requiring significant changes to existing fabrication flows.

According to an exemplary embodiment of the present invention, the multiple-opening SIC implant mask is patterned such that the minimum dimensional size (e.g., width) of each of the multiple openings is in a range of 0.1 µm to 0.25 μm. A ratio of the dopant concentration generated in the secondary increased-doping regions to the dopant concentration of the one or more primary increased-doping regions is determined by the size (width) of each of the multiple mask openings. When the mask openings are relatively small (e.g., 0.1 μm to 0.12 μm), the dopant concentration generated in the secondary increased-doping regions is substantially equal to or slightly lower than (i.e., within an order of magnitude of the dopant concentration of the one or more primary increased-doping regions). Dopant concentrations generated in the secondary increased-doping regions gradually diminish below the order-of-magnitude level as the mask opening size is increased above 0.12 μm up to 0.25 μm, but HBTs produced using these larger mask opening sizes were still found exhibit enhanced (increased) Ft*BVceo metric values. When each of the multiple mask openings was made greater than 0.25 μm, the present inventors determined that the resulting mask edge effect was minimal, and HBTs produced in this manner did not exhibit significantly enhanced Ft*BVceo metric values over HBTs produced using conventional single-mask-opening techniques. Therefore, by forming each of the multiple SIC mask openings with minimum size dimension (e.g., width) in the range of 0.1 μm to 0.25 μm, the SIC implant process of the present invention forms secondary increased-doping regions capable of sufficiently modifying an HBT's base-collector junction such that the HBT exhibits enhanced Ft*BVceo metric values. Because the localized doping concentration of the secondary increased-doping regions may be beneficially generated utilizing mask opening sizes that may be varied in the range of 0.1 μm to 0.25 μm, the present invention may be implemented in various HBT fabrication processes (flows) to generate both novel larger HBTs that exhibit operating characteristics similar to those of smaller conventional HBTs, and novel smaller HBTs exhibiting superior operating characteristics in comparison to conventional smaller HBTs.

According to a practical exemplary embodiment of the present invention, an NPN-type HBT is fabricated on a semiconductor substrate having a p-type conductivity, wherein the SIC implant process is performed after an N+ buried layer region and an N+ collector sinker are formed adjacent to the collector region using separate implant masks having conventional single opening configurations. In this case, the SIC region is formed by implanting a (second) n-type SIC dopant into the collector region through the multiple-opening mask described above, then forming a base structure by way of depositing an patterning a p-doped material layer (e.g., SiGe) over the SIC region, and then forming the emitter structure by depositing and patterning an n-doped silicon structure on an upper surface of the base structure.

According to alternative specific embodiments, SIC implant masks of the present invention are formed by patterning a resist material layer such that multiple parallel elongated openings are disposed over rectangular-shaped collector regions associated with each HBT. In one specific embodiment, the SIC implant mask is patterned such that each parallel elongated mask opening extend the entire length of an associated rectangular-shaped collector region, and are centered in a widthwise direction over the associated rectangular-shaped collector region. In a second specific embodiment, the SIC implant mask is patterned such that each parallel elongated mask opening extends in a widthwise direction of an associated rectangular-shaped collector region. In a third specific embodiment, the SIC implant mask is patterned such that mask opening are arranged in an array configuration (i.e., both in the lengthwise and widthwise directions of the associated rectangular-shaped collector region). In each specific embodiment, the minimum dimension (i.e., the spacing between opposing side edges of the resist material that define each opening) is in the range of 0.1 μm to 0.25 μm.

The present invention is also directed to HBTs fabricated using the methodology mentioned above, where each HBT is characterized by including an SIC region having both primary (deep) increased-doping regions and secondary (shallow) increased-doping regions that are generated by resist edge effects, where the secondary (shallow) increased-doping regions provides substantially higher doping concentrations at the uppermost portion of the SIC region than those present in typically formed HBTs, thereby enhancing base-collector junction between the SIC region and the subsequently-formed base structure.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to HBTs with improved operating characteristics. The following description is presented to enable one of ordinary skill in the art to make and use the invention as provided in the context of a particular application and its requirements. As used herein, directional terms such as "upper", "uppermost", "lower", "central", "downward", "left" and "right", are intended to provide relative positions for purposes of description and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
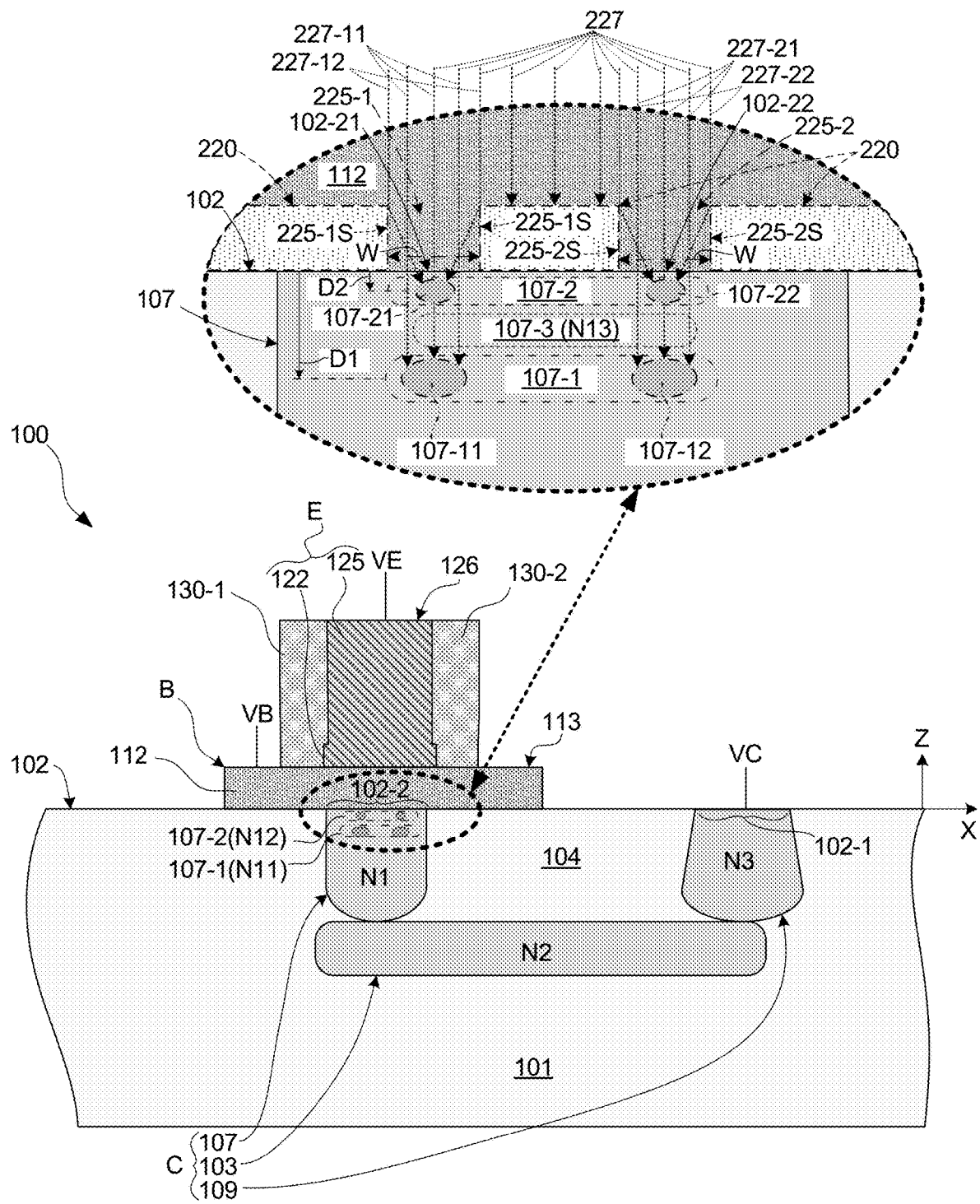
FIG. 1 is a cross-sectional side view showing a simplified HBT produced in accordance with an exemplary embodiment of the present invention.

FIG. 1 includes a cross-sectional side view showing a simplified HBT 100 produced on a semiconductor substrate 101 in accordance with an exemplary embodiment of the present invention. HBT 100 is described below as an NPN-type transistor formed on a p-type substrate, but may alternatively be implemented as a PNP-type transistor formed on a p-type substrate by way of reversing the dopant conductivity types mentioned below (i.e., using an n-type dopant in place of a p-type dopant, and vice versa). Moreover, the specific shapes and sizes of the various structures and implants that collectively form HBT 100 are depicted for exemplary purposes, and those skilled in the art will recognize that the associated structures/implants may be implemented using other configurations without departing from the spirit and scope of the present invention.

Referring to the lower portion of FIG. 1, HBT 100 includes an n-type collector C formed by one or more n-type dopants that is/are diffused into substrate 101, a p-type base structure B formed on an upper surface 102 of substrate 101 over at least a portion of collector C, and an n-type emitter structure E that is formed on base structure B such that a portion of base B is disposed between collector C and emitter E.

In the exemplary embodiment, collector C is implemented using contiguous n-doped regions including a buried layer region 103, a selectively implanted collector (SIC) region 107 and a collector sinker 109. An upper portion of collector sinker 109 coincides with an associated section 102-1 of upper surface 102, and a lower portion of collector sinker 109 contacts a first (e.g., right) end of buried layer region 103. An upper portion of SIC region 107 forms a base-collector junction with base B at an associated section 102-2 of upper surface 102, and a lower portion of SIC region 107 contacts a second (e.g., left) end portion of buried layer region 103. To facilitate proper operation of HBT 100, SIC region 107 is formed using three n-type implant processes selected such that an average n-type dopant concentration N1 that is lower than an average n-type dopant concentration N2 of buried layer region 103, and an average n-type dopant concentration N1 is also lower than an average n-type dopant concentration N3 of collector sinker 109. This configuration facilitates the transmission of collector signals VC between the base-collector junction and associated circuitry (not shown) by way of upper surface section 102-1.

As mentioned above, base B and emitter E may be implemented using any known configurations, and are depicted in an exemplary form as reference structures for describing HBT 100. In the exemplary embodiment, base B includes an intrinsic base structure 112 that is formed on upper surface 102 over section 102-2, and is controlled by a base signal VB applied, for example to an upper surface 113 of base structure 112. In one embodiment, intrinsic base structure 112 comprises a p-doped silicon structure such as Silicon-Germanium (SiGe). Emitter E comprises a block of n-doped polycrystalline Si having a lower end portion 122 that contacts an upper surface of intrinsic base layer 112 over SIC region 107, and an upper surface 125 that facilitates the transmission of emitter signals VE between the base-collector junction and associated circuitry (not shown) by way of backend metallization (not shown). Additional structures and features of HBT 100 are either discussed below or omitted for brevity.

HBT 100 is distinguished from conventional HBTs by including multiple spaced-apart increased-doping regions 107-1 and 107-2 formed in the upper portion of SIC region 107 that are formed in the upper portions of SIC region 107. Specifically, referring to the bubble at the top of FIG. 1, SIC region 107 is formed such that it includes one or more primary increased-doping regions 107-1 disposed at a first depth D1 below upper surface 102 of substrate 101, and two or more secondary increased-doping regions 107-2 that are disposed as a shallower (second) depth D2 below upper surface 102. Primary increased-doping regions 107-1 are localized regions of increased n-type dopant concentration disposed at a relatively deep (first) depth D1 below substrate surface 102, where depth D1 is determined by implant process parameters such as the energy of the n-type dopants directed into substrate 101 during the SIC implant process (described below). In the exemplary embodiment, primary increased-doping regions 107-1 are depicted as including two regions 107-11 and 107-12 that are spaced apart in a horizontal (e.g., X-axis) direction within substrate 101, but in some embodiments these regions may merge to form a single elongated implant region during or after the SIC implant process. Secondary increased-doping regions 107-2 are localized regions of increased n-type dopant concentration disposed at a relatively shallow (second) depth D2 below substrate surface 102, where depth D2 is at or slightly below surface 102 and is determined by a combination of the implant process parameters and mask edge effects. Secondary increased-doping regions 107-2 are characterized by having doping concentrations N12 that are higher than average doping concentration N1 of SIC region 107, and preferably within an order of magnitude of a doping concentration N11 of primary increased-doping regions 107-1. An intervening region 107-3 of SIC region 107 disposed between secondary increased-doping regions 107-2 and primary increased-doping regions 107-1 has an n-type doping concentration N13 that is lower than doping concentrations N11 and N12.

As depicted in the bubble provided at the top of FIG. 1 and explained in additional detail below, SIC dopant 227 is directed (as indicated by the dotted-line arrows) onto an SIC implant mask 220 during the SIC implant process, where SIC implant mask 220 is depicted by superimposed photoresist blocks disposed on corresponding portions of substrate surface 102. Note that the SIC implant process is performed prior to the formation of base structure B/112, whereby the superimposed photoresist blocks depicting mask 220 in the bubble are drawn using dashed lines to indicate they do not exist when base structure B/112 is present.

During the SIC implant process, first portions 227-11 and 227-21 of SIC dopant 227 respectively pass directly through openings 225-1 and 225-2 and enter substrate 101 by way of exposed surface portions 102-21 and 102-22, whereby first portions 227-11 and 227-21 become implanted in substrate 101 in a manner that forms one or more primary increased-doping regions 107-1 (e.g., two spaced-apart regions 107-11 and 107-12, or a single merged region) at a depth D1 and diffuse in substrate 101 to form the remainder of n-type SIC region 107. In addition, second portions 227-12 and 227-22 of SIC dopant 227 are directed against side edges 225-1S and 225-2S of openings 225-1 and 225-2 and are deflected such that second portions 227-12 and 227-22 enter substrate 101 through exposed surface portions 102-21 and 102-22 at an acute angle. The resulting lower energy of second portions 227-12 and 227-22 (i.e., compared to the energy of first portions 227-11 and 227-21) cause these portions to generate secondary increased-doping regions 107-2 at a depth D1 that is closer to substrate surface 102 than depth D2 of primary increased-doping regions 107-1. Accordingly, both primary increased-doping regions 107-1 and secondary increased-doping regions 107-2 are simultaneously formed below each mask opening 125-1/2 during the SIC implant process such that, as depicted by the example shown in the bubble of FIG. 1, each secondary increased-doping region 107-21 and 107-22 is respectively vertically positioned (i.e., in the Z-axis direction) between a corresponding primary increased-doping regions 107-11 and 107-12 and substrate surface 102. By forming two or more mask openings 225-1 and 225-2 over collector region 104 of HBT 100 during the SIC implant process, the present invention facilitates an increased concentration of SIC dopant 227 near substrate surface 102 (i.e., closer to the subsequently formed base-collector interface) by way of intentionally increasing the amount of resist mask edge effect occurring during the SIC implant process (i.e., in comparison to that produced by way of a single mask opening). Accordingly, by forming mask 220 such that it includes multiple openings (i.e., instead of a single opening as used in conventional methods), the modified SIC implant process increases the amount of deflected SIC implant material, thereby producing secondary increased-doping regions 107-2 at or just below substrate surface 102. Further, by forming SIC implant mask 220 such that opposing edges 225-1S of opening 225-1 and opposing edges 225-2S of opening 225-2 are respectively separated by a width (distance) W in the range of 0.1 μm to 0.25 μm, where width W represents the minimum lateral orthogonal (i.e., X-axis or Y-axis) spacing dimension of openings 225-1 and 225-2, secondary increased-doping regions 107-2 are generated having a doping concentration N12 that is sufficient to generate improved HBT operating characteristics. The inventors have experimentally determined that forming SIC region 107 with secondary increased-doping regions 107-2 produced in this manner provide HBT 100 with an enhanced base-collector junction resulting in improved Kirk Effect characteristics, as evidenced by improved HBT operating characteristics.

FIGS. 2A to 2F depict HBT 100 during various phases of a fabrication process performed in accordance with an embodiment of the present invention. FIGS. 2A to 2F depict exemplary partial HBT structures at various time periods t1 to t6 during the fabrication process. The partial HBT structures are consistent with completed HBT 100 (shown in FIG. 1) and are therefore respectively identified as 100(t1) to 100(t6) in FIGS. 2A to 2F. Note that FIGS. 2A to 2F depict processes deemed relevant to the present invention, and that several intervening and additional process steps, which are known in the art, may be omitted from the depicted structures and from the discussion below for brevity.

Figure 2A:
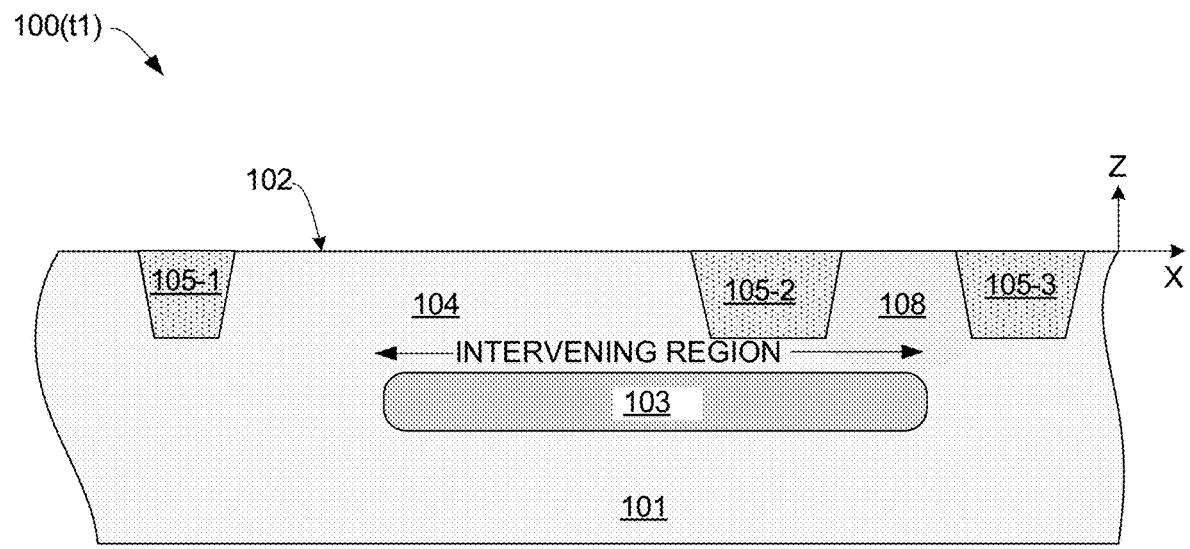
FIGS. 2A, 2B, 2C, 2D, 2E and 2F depict the HBT of FIG. 1 during various phases of a fabrication process performed in accordance with an embodiment of the present invention.

FIG. 2A shows a schematic cross-sectional view of partial HBT 100(t1) during an early fabrication phase after semiconductor substrate 101 has been fabricated with buried layer region 103 operably disposed below upper surface 102 such that buried layer region 103 is separated in a vertical (Z-axis) direction from upper surface 102 by intervening regions of semiconductor substrate 101, which in the depicted embodiment include a portion of collector region 104 and a portion of collector contact region 108. In one embodiment semiconductor substrate 101 is formed with a P-type conductivity (first conductive type) generated by the predominant presence of one or more P-type dopants diffused in a semiconductor (e.g., monocrystalline and/or polycrystalline silicon) wafer. Buried layer region 103 is disposed in an internal region of substrate 101 and extends parallel to upper surface 102, and is formed by diffusing one or more N-type dopants such that buried layer region 103 has an N-type conductivity (second conductive type; i.e., the predominant dopant type in buried layer region 103 is N-type). Collector portion 104 and collector contact portion 108, which are disposed between upper surface 102 and opposing ends of buried layer region 103, respectively, have a P-type conductivity similar to the remainder of substrate 101 at time t1. In one embodiment, buried layer region 103 is formed by diffusion N-type dopant into a base monocrystalline Si wafer, and then forming the intervening regions (including portions 104 and 108) on the base Si wafer using well-known epitaxial growth processes. Semiconductor substrate 101 is also formed with optional isolation structures 105-1, 105-2 and 105-3 that serve to electrically isolate different regions of HBT 100(t1), and to electrically isolate HBT 100(t1) from adjacent elements (e.g., neighboring HBTs, not shown). In a presently preferred embodiment, isolation structures 105-1, 105-2 and 105-3 comprise SiO$_2$ formed in accordance with known shallow trench isolation (STI) techniques such that STI structures 105-1, 105-2 and 105-3 are at least partially exposed on surface 102 and extend in parallel (i.e., are elongated in a Y-axis direction perpendicular to the plane of the figure) along surface 102. Collector region 104 of substrate 101 is located between outer STI structure 105-1 and inner STI structure 105-2, and collector contact region 108 is located between inner STI structure 105-2 and outer STI structure 105. Note that buried layer region 103 extends between collector region 104 and collector contact region 108 such that it extends under inner STI structure 105-2. Additional isolation structures, such as deep trench isolation (DTI) structures, may also be formed using known techniques to further isolate the active region of substrate 101 occupied by HBT 100(t1) from adjacent elements.

Figure 2B:
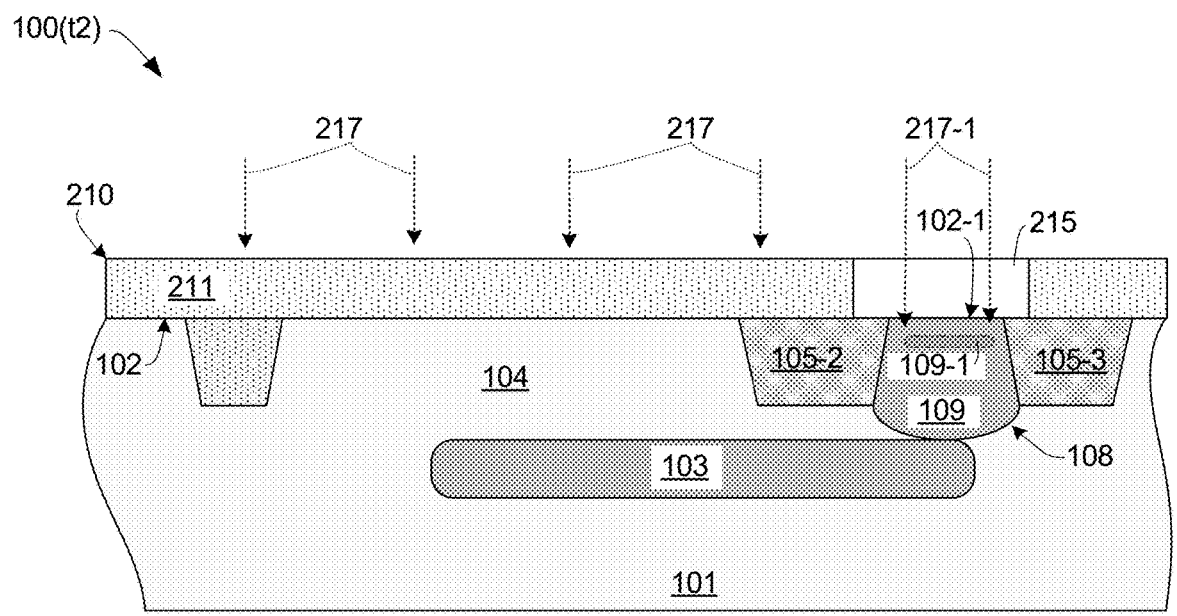
Figure 2C:
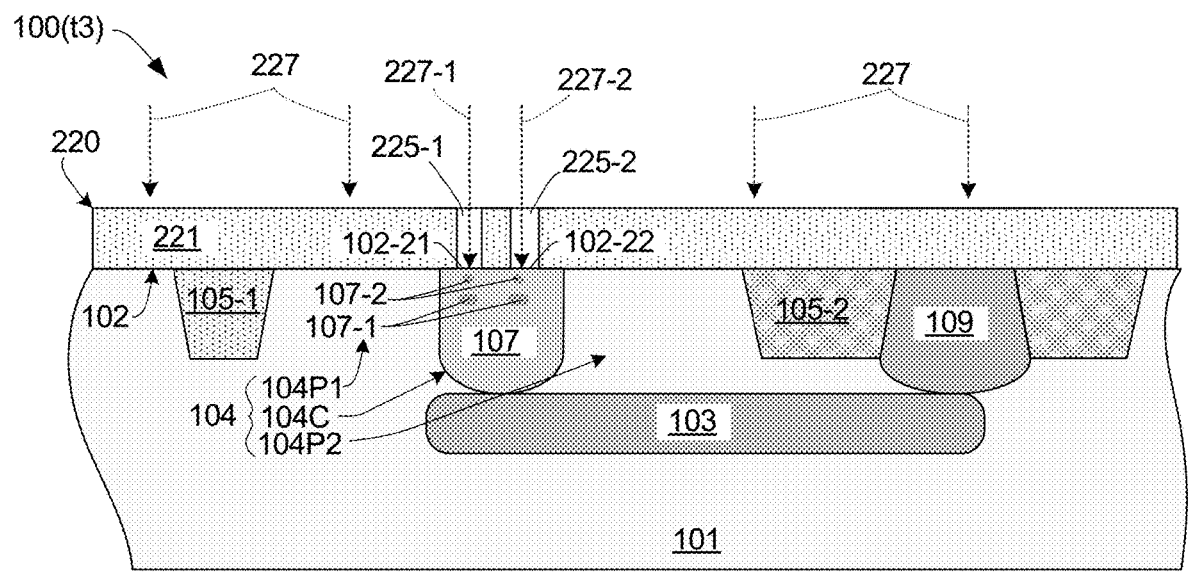

FIGS. 2B and 2C depict two separate n-type implant processes. FIG. 2B depicts a first implant process utilized to form a collector sinker 109 in collector contact region 108 using a first mask 210 that is patterned using a conventional technique, and is provided to emphasize the novel mask pattern of a second (SIC implant) mask 220, which is described with reference to FIG. 2C. FIG. 2C depicts a second implant process utilized to form SIC region 107 in collector region 104 using SIC mask 220, which is patterned in accordance with a generalized embodiment of the present invention as described in detail below. In addition to utilizing two different masks, in a presently preferred embodiment the two implant processes depicted in FIGS. 2B and 2C are performed using techniques known in the art such that an average concentration of n-type dopants in SIC region 107 is less than an average concentration of n-type dopants in collector sinker region 109. For example, the SIC implant process is performed using an N-type implant process of a standard CMOS fabrication flow that produces a relatively low average n-type doping concentration in collector region 104, and the collector sinker implant process is performed using an N+ implant process of the standard CMOS fabrication flow) that produces a relatively high average n-type doping concentration in collector contact region 108.

Referring to FIG. 2B, in the formation of collector sinker 109 involves depositing and patterning a first photoresist layer 211 to form implant mask 210 over upper surface 102 such that a single mask opening 215 is formed and located over collector contact region 108, and then directing n-type dopant particles 217 (e.g., Phosphorus or Arsenic) through opening 215 in a manner that forms collector sinker 109. By way of comparison with the formation of SIC region 107 (discussed below), collector sinker mask 210 is patterned using a conventional single-opening technique such that n-type dopant particles 217 form a primary increased-doping region 109-1 at a depth determined by the associated implant process, and such that n-type dopant particles migrate or otherwise become diffused in collector contact region 108 such that collector sinker 109 includes an N+ doping concentration that extends laterally between inner STI structure 105-2 and outer STI structure 105-3, and vertically from an exposed portion 102-1 of upper surface 102 to buried layer region 103.

Referring to FIG. 2C, the formation of SIC region 107 involves forming an SIC implant mask 220 on upper surface 102, and then directing n-type dopant particles 217 (e.g., Phosphorus or Arsenic) toward implant mask 220 (e.g., in the direction indicated by the dot-line arrows) such that at least some of dopant particles 217 pass through openings defined in the photoresist and through corresponding exposed portions of substrate surface 102 into collector region 104. The formation of SIC implant mask 220 involves depositing a photoresist layer 221 on upper surface 102, and then patterning photoresist layer 221 using known techniques. According to an aspect of the present invention, SIC implant mask 220 is formed such that at least two mask openings 225-1 and 225-2 are formed over a central portion 104C of collector region 104, whereby a first portion of dopant particles 227 (first particles 227-1) enter central portion 104C by way of passing through mask opening 225-1, and a second portion 227-2 of dopant particles 227 enter central portion 104C by passing through mask opening 225-2. As explained above with reference to FIG. 1, mask openings 225-1 and 225-2 are formed over a central region 104C of collector region 104 such that they facilitate the increased occurrence of resist mask edge effects produced by the side edges of mask openings 225-1 and 225-2, thereby creating both shallow increased-doping regions 107-2 adjacent to corresponding substrate surface sections 102-1 and 102-2 of the semiconductor substrate 101, and deep increased-doping regions 107-1 that are disposed below each shallow increased-doping regions 107-2, where both increased-doping regions 107-1 and 107-2 have a substantially higher doping concentration than an average of the n-type doping concentration of a remainder of SIC region 107. As understood in the art, the remainder of dopant particles 227-1 implanted into central region 104C diffuse into the surrounding substrate material to form SIC region 107 in collector region 104 in order to provide an electrical path between the subsequently formed base-collector interface and buried layer region 103. In the disclosed embodiment SIC region 107 is formed such that it is separated from outer STI structure 105-1 by a first peripheral P-type portion 104P1 of collector region 104 and is separated from inner STI structure 105-2 by a second peripheral P-type portion 104P2 of collector region 104. In other possible embodiments n-type material initially extends between outer STI structure 105-1 and inner STI structure 105-2, and a p-type dopant is subsequently implanted into peripheral portions 104P1 and 104P2. As mentioned above with reference to FIG. 2A, peripheral portions 104P1 and 104P2 comprise very lightly doped (i.e., either lightly N-doped or lightly P-doped) material that is formed during an epitaxial silicon growth process, and the STI implant process is performed such that there is no intentional implant/diffusion of dopants into these regions.

The resist edge effects described above are similar to well proximity effects observed in the fabrication of CMOS field-effect transistors (FETs), but produces entirely different electrical effects which lead to performance enhancements in the case of HBTs. That is, in FET devices, if the resist edge of a P-Well (i.e., in the case of an NFET) or an N-Well (in the case of a PFET) is close to the active part of a FET, dopants scattered by mask edge effects in the manner described above in FIG. 1 form shallow high-concentration regions in the channel of the FET that function to increase the FET's threshold voltage. The present inventors discovered that the similar technique described herein, when utilized during the collector implantation process during fabrication of a HBT (e.g., HBT 100 described herein or other analog device) provides an improvement in the key metric of Ft*BVceo (effectively, transistor switching speed multiplied by transistor breakdown) relative to a more simplistic change enabled by simply increasing or decreasing the doping in a single-window layout device.

Figure 2D:
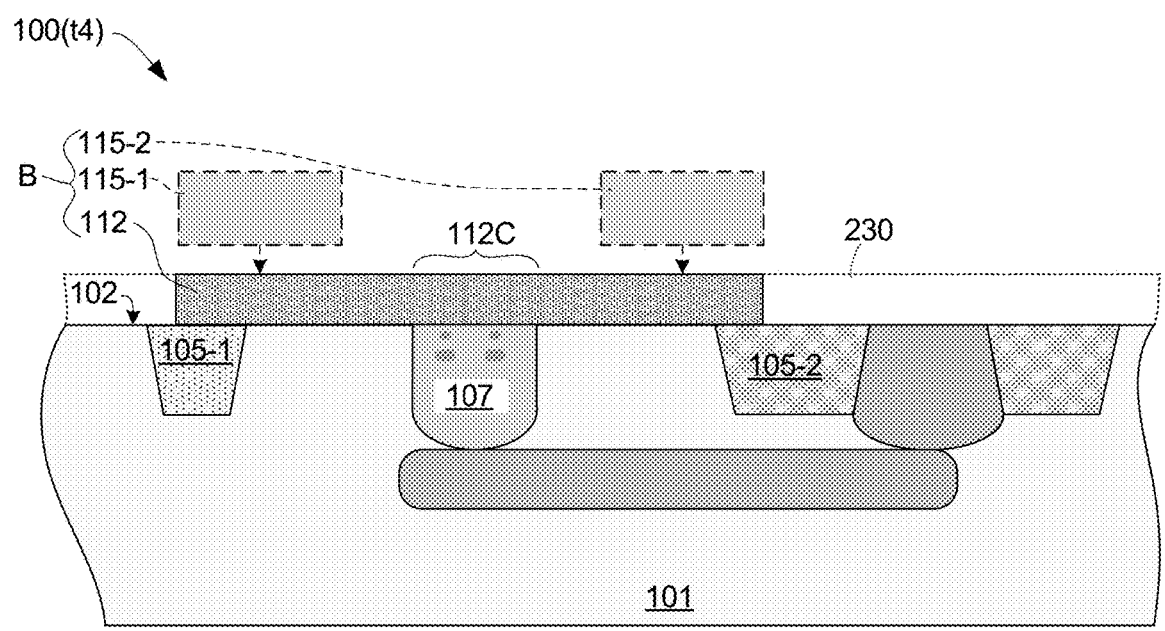
Figure 2E:
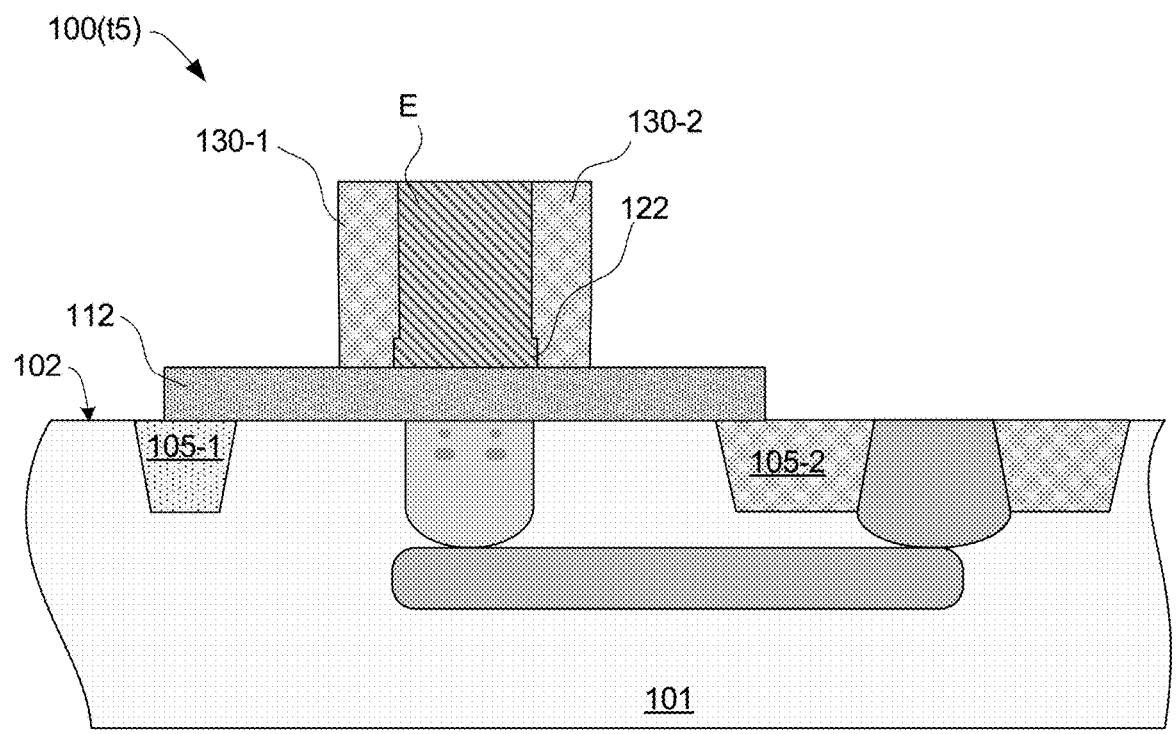
Figure 2F:
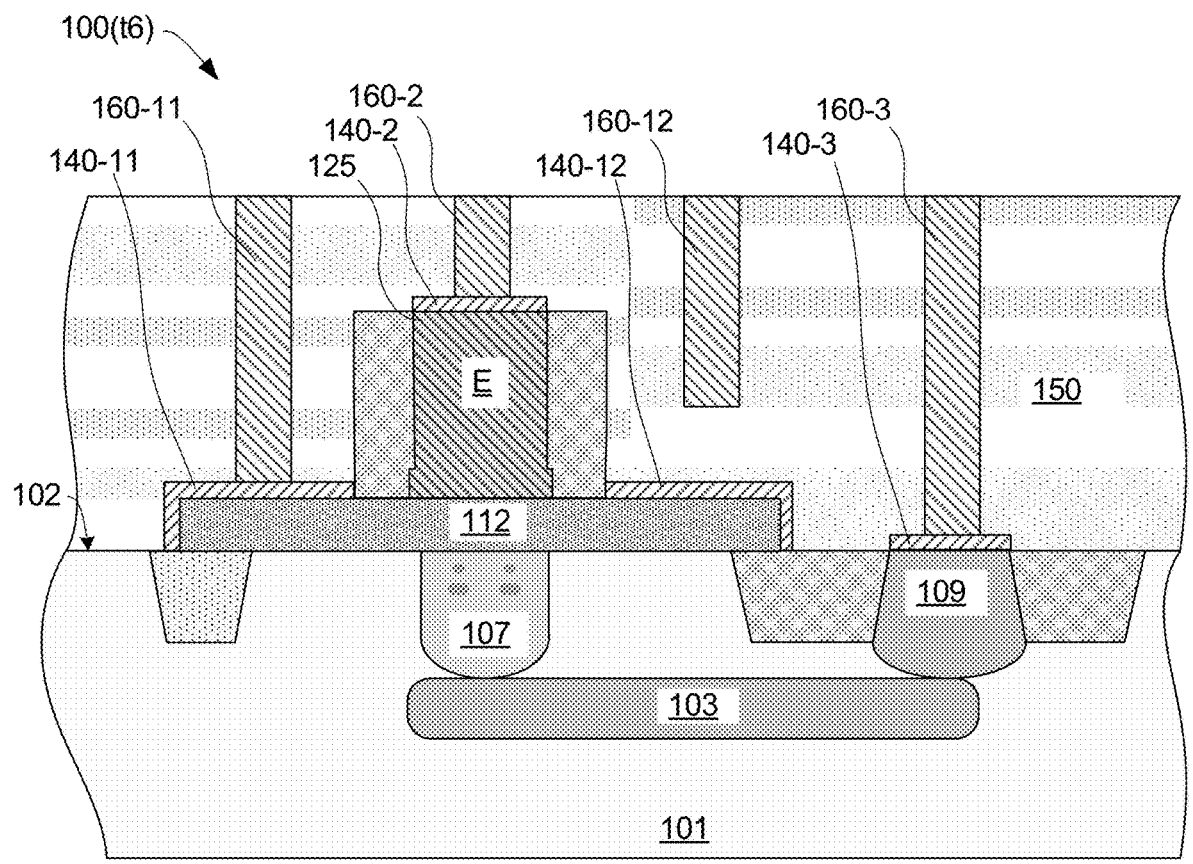

FIGS. 2D to 2F show exemplary process steps utilized to complete the production of HBT 100 (i.e., after the formation of collector C). The structures and processes described below are intended to be exemplary, and may be implemented using any suitable materials, configurations and process parameters, and as such are not intended to be limiting to the appended claims unless otherwise specified.

FIG. 2D depicts HBT 100 at a time t4 after base structure B is at least partially formed on upper surface 102 such that base structure B is at least partially disposed over SIC region 107. In one embodiment, the formation of base structure B at time t4 involves epitaxially growing a silicon-germanium (SiGe) base layer 230 on upper surface 102, and then patterning the SiGe layer to form to form intrinsic base structure 112 over collector region 104. In a presently preferred embodiment, intrinsic SiGe structure 112 includes an epitaxial SiGe portion formed at least over SIC region 107, and may include a poly-crystalline SiGe portion in areas extending over STI structures 105-1 and 105-2. Intrinsic SiGe structure 112 may comprise a Si buffer, a SiGe layer and/or a Si cap layer with boron doping). One or more optional extrinsic base structures may be formed on portions of intrinsic SiGe structure 112 to facilitate the transmission of a base signal to the base-collector junction during operation.

FIG. 2E depicts HBT 100 at a time t5 after an emitter structure E is formed over intrinsic base structure 112 such that a lower portion 122 of emitter structure E is positioned over (i.e., substantially vertically aligned with) SIC region 107. In one embodiment, emitter structure E comprises n-doped polycrystalline silicon formed in accordance with known techniques.

FIG. 2F is a simplified cross-sectional view showing HBT 100 at a time t6 after pre-metal dielectric deposition and initial stages of a "Metal 1" (backend metallization) process have been performed. First, a salicide formation process is utilized to form silicide structures 140-11 and 140-12 over exposed upper surface sections of intrinsic SiGe base structure 112, and over side edges of intrinsic base structure 112, to form a silicide structure 140-2 over upper portion 125 of emitter structure E, and to form a silicide structure 140-3 on a portion of upper surface 102 of substrate 101 located over collector sinker 109. Dielectric material 150 is then deposited and patterned using known techniques, and then metal contacts 160-11, 160-12, 160-2 and 160-3 are formed using known techniques that contact upper surfaces of silicide structures 140-11, 140-12, 140-2 and 140-3, respectively.

Figure 3A:
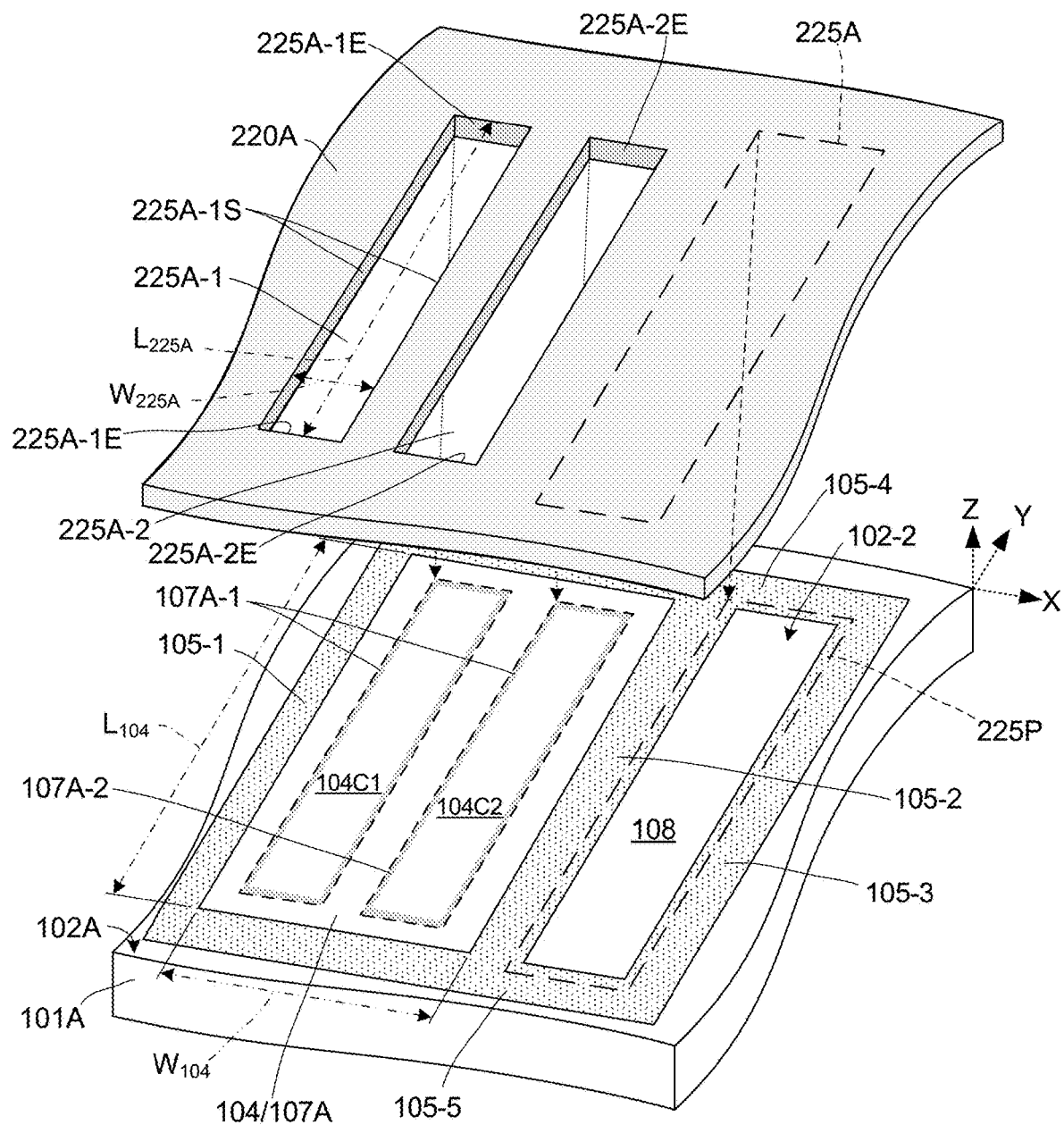
FIGS. 3A, 3B and 3C are exploded perspective views showing SIC implant masks utilized in the SIC implant process of FIG. 2C according to alternative simplified embodiments of the present invention.
Figure 3B:
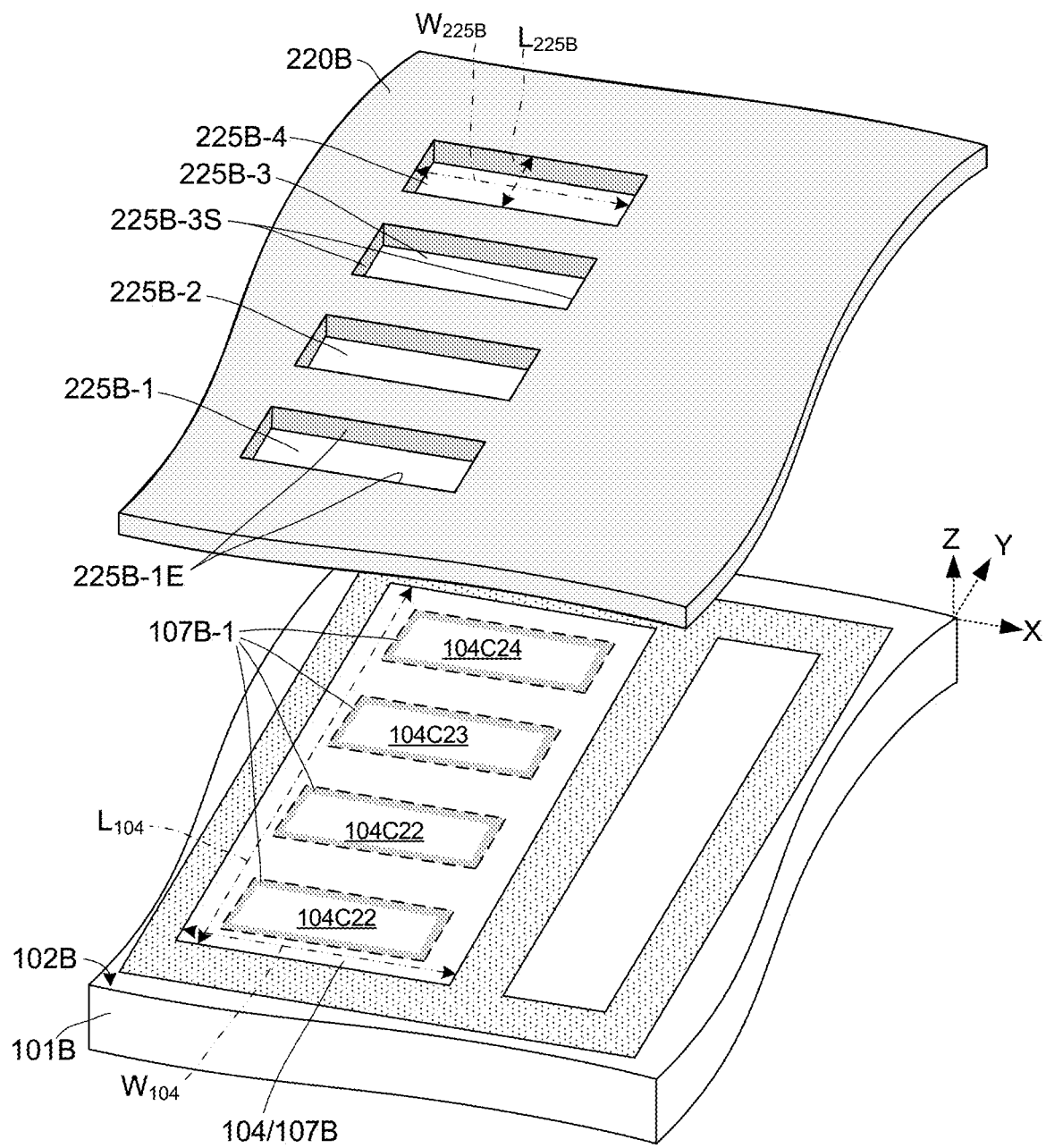
Figure 3C:
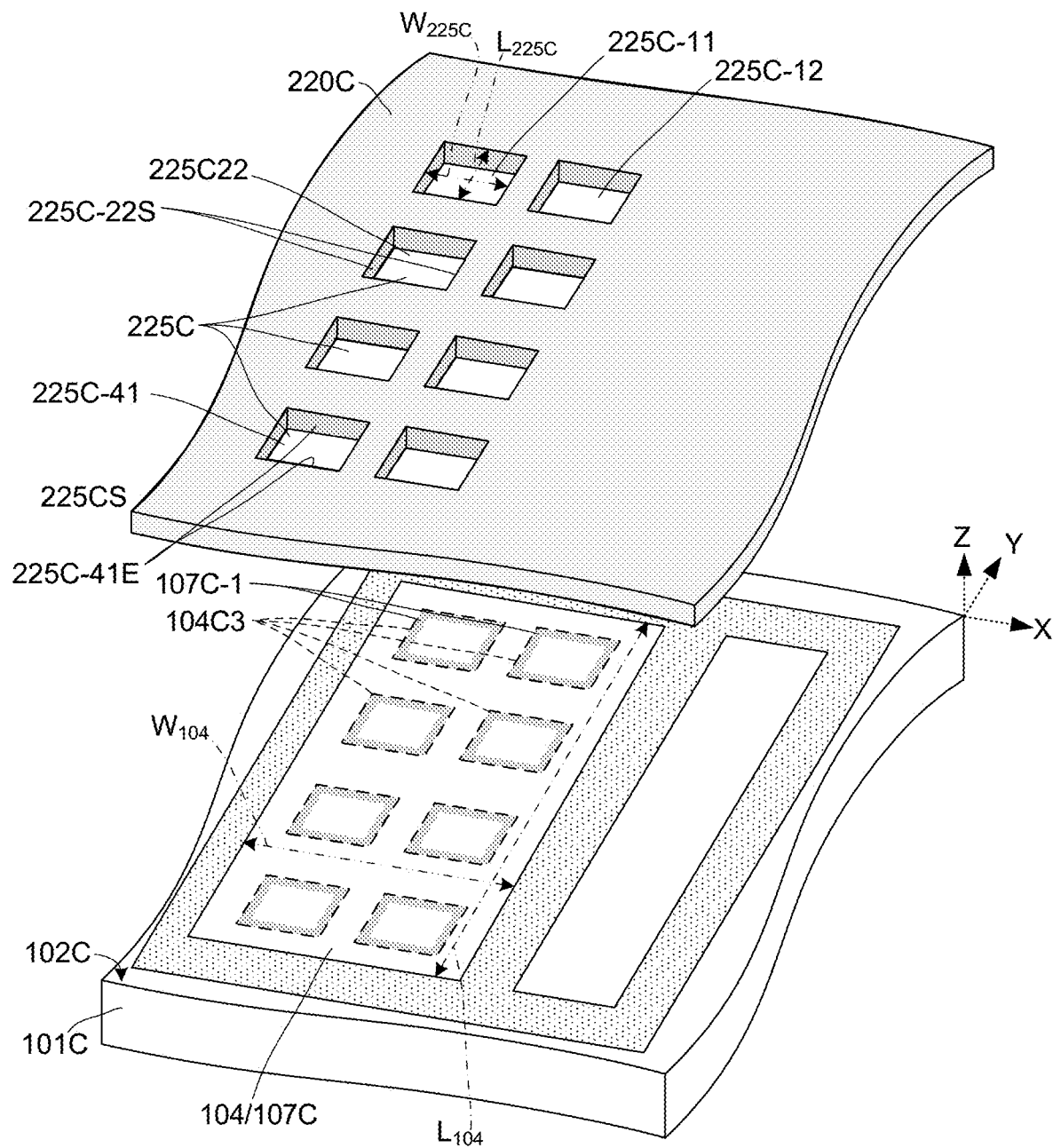

FIGS. 3A to 3C are exploded perspective views depicting SIC implant masks utilized during the formation of SIC region 107, which is discussed above with reference to FIG. 2C, according to alternative practical embodiments of the present invention. The exemplary embodiments are simplified for descriptive purposes, and are not necessarily drawn to scale. Moreover, the numbers and positions of mask openings described with reference to FIGS. 3A to 3C may vary from the numbers and placements depicted in these figures.

FIG. 3A depicts a first exemplary SIC implant mask 220A disposed over a corresponding region of substrate 101A, where SIC implant mask 220A is patterned to include multiple parallel elongated openings that are aligned in a widthwise direction over collector region 104. Referring to upper surface 102A of substrate 101A in the lower portion of FIG. 3A, collector region 104 is a rectangular region having a width dimension $W_{104}$ extending in a widthwise (e.g., X-axis) direction between outer STI structure 105-1 and inner STI structure 105-2, and having a length dimension $L_{104}$ extending in a lengthwise (e.g., Y-axis) direction extending between parallel end STI structures 105-4 and 105-5. According to the first exemplary embodiment, SIC implant mask 201A is patterned to include two elongated parallel openings 225A-1 and 225A-2, where the longer side edges of each opening 225A-1 and 225A-2 (e.g., side edges 225A-1S of opening 225A-1) extend parallel to the lengthwise (Y-axis) direction, and the shorter end edges of each opening 225A-1 and 225A-2 (e.g., end edges 225A-2E of opening 225A-2) are aligned and extend parallel to the widthwise (X-axis) direction, with openings 225A-1 and 225A-2 being entirely located over collector region 104 (i.e., such that the side and end edges of openings 225A-1 and 225A-2 intersect and surround corresponding central portions 104C1 and 104C2 of collector region 104). During the SIC implant process depicted in FIG. 2C, n-type dopants pass through elongated parallel openings 225A-1 and 225A-2 and enter substrate 101A, thereby forming SIC region 107A in collector region 104. In addition, mask edge effects generate two rectangular-shaped increased-doping regions 107A-1 along the peripheral borders of corresponding central portions 104C1 and 104C2, where the size and shape of each rectangular-shaped increased-doping region 107A-1 corresponds with the size and shape of elongated parallel openings 225A-1 and 225A-2. Although SIC implant mask 220A is depicted as including only two openings aligned in the widthwise direction of collector region 104, in some embodiments an SIC mask may be patterned to include three or more parallel openings aligned in the widthwise direction.

Referring to the left side of FIG. 3A, a dashed-line rectangle 225A is superimposed on mask 220A to indicate the location of opening 225 in the previously-formed mask 220, which is shown and described above with reference to FIG. 2C. As indicated by the corresponding projection 225P of opening 225A on surface 102A, the side edges of mask opening 225A are disposed over inner STI structure 105-2 and outer STI structure 105-3, and the end edges of mask opening 225A are aligned with end STI structures 105-4 and 105-5, whereby the n-type doping material implanted during the formation of the collector sinker in collector contact portion 108 avoids the formation of increased-doping regions by way of the mask edge effect described above.

FIG. 3B depicts a second exemplary SIC implant mask 220B disposed over a corresponding region of substrate 101B, where SIC implant mask 220B is patterned to include a single column of elongated parallel openings 225B-1 to 225B-4 that are aligned in the lengthwise direction over collector region 104. As described above with reference to FIG. 3A, collector portion 104 has width dimension $W_{104}$ extending in the widthwise (e.g., X-axis) direction, and has a length dimension $L_{104}$ extending in a lengthwise (e.g., Y-axis) direction. According to the second exemplary embodiment, SIC implant mask 220B is patterned such that the shorter side edges of each opening 225B-1 to 225B-4 (e.g., side edges 225B-3S of opening 225B-3) are aligned and extend parallel to the lengthwise (Y-axis) direction, and the longer end edges of each opening 225B-1 to 225B-4 (e.g., end edges 225B-1E of opening 225B-1) extend parallel to the widthwise (X-axis) direction, whereby openings 225B-1 to 225B-4 are aligned in the lengthwise direction. During the n-type implant depicted in FIG. 2C, n-type dopants pass through openings 225B-1 to 225B-4 and enter substrate 101A, thereby forming SIC region 107B in collector portion 104. In addition, mask edge effects generate two rectangular-shaped increased-doping regions 107B-1 around corresponding collector sub-portions 104C21 to 104C24, where the size and shape of each rectangular-shaped increased-doping region 107B-1 corresponds with the size and shape of elongated parallel openings 225B-1 to 225B-4, respectively. Although SIC implant mask 220B is depicted as including four openings aligned in the lengthwise direction of collector region 104, in some embodiments an SIC mask may be patterned to include five or more parallel openings aligned in the lengthwise direction.

FIG. 3C depicts a third exemplary SIC implant mask 220C disposed over a corresponding region of substrate 101C, where SIC implant mask 220C is patterned to include multiple openings 225C arranged in an array made up of four rows and two columns. Similar to the previous examples, collector portion 104 has width dimension $W_{104}$ and a length dimension $L_{104}$, and SIC implant mask 201B is patterned such that each row (e.g., openings 225C-11 and 225C-12) is aligned parallel to the widthwise (X-axis) direction, and each column (e.g., including openings 225C-11, 225C-21 and 225C-41) is aligned parallel to the lengthwise (Y-axis) direction. Each opening 225C is substantially square-shaped and has opposing end edges (e.g., end edges 225C-41E of opening 225C-41) extending parallel to the widthwise (X-axis) direction, and opposing side edges (e.g., side edges 225C-21S of opening 225C-21) aligned in the lengthwise (Y-axis) direction. During the n-type implant depicted in FIG. 2C, n-type dopants pass through openings 225C and enter substrate 101A, thereby forming SIC region 107C in rectangular-shaped collector region 104, whereby mask edge effects caused by the opposing side and end edges of each opening 225C generate substantially square-shaped increased-doping regions 107C-1 around corresponding collector sub-region 104C3. Although SIC implant mask 220C is depicted as including eight openings arranged in four rows and two columns, in some embodiments an SIC mask may be patterned to include openings arranged in five or more rows and/or three or more columns.

Figure 4:
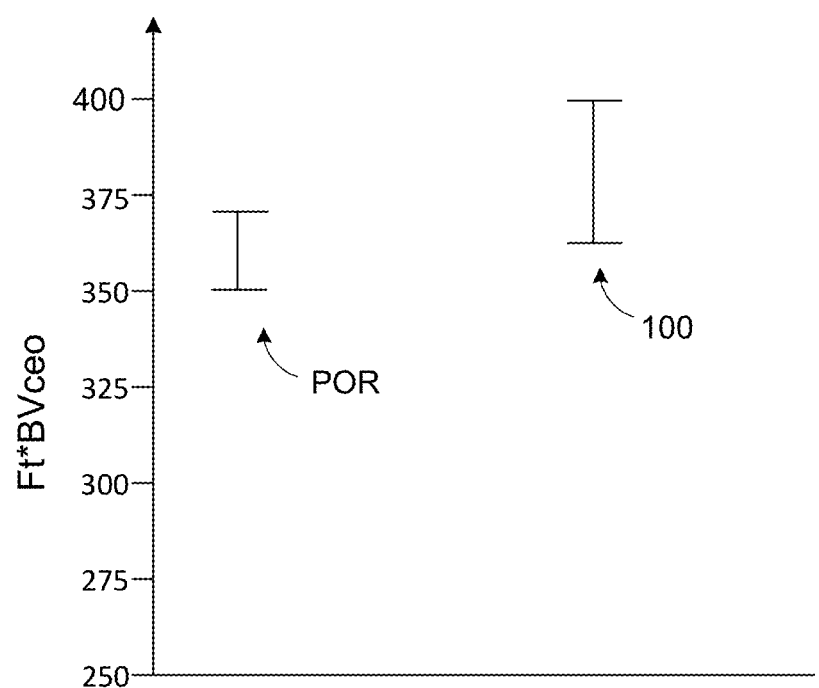
FIG. 4 is a graphic representation comparing measured operating characteristic values from conventional HBTs and HBTs produced in accordance with the present invention.

FIG. 4 includes a comparison graph showing operating characteristics for HBTs 100 produced in accordance with the present invention, and comparable conventional HBTs fabricated using conventional process of record (POR) methods, where both sets of HBTs were fabricated with comparable size parameters using a 180 nm CMOS fabrication flow. Specifically, FIG. 4 depicts experimentally measured Ft*BVceo value ranges for conventional (POR) HBTs and HBTs produced in accordance with the present invention. The Ft*BVceo values represent a product of peak operation frequency by peak voltage handling (i.e., breakdown voltage BVceo) represents the most standard figure of merit used to describe HBTs. Peak operating frequency and peak voltage handling can always be traded off (i.e., one increased at the expense of decreasing the other), but the product of the two values indicates an overall level of performance of a given HBT device. As a reference point, SiGe HBTs show an Ft*BVceo product that is roughly two to three times higher than that of a standard silicon bipolar device. FIG. 4 shows that HBTs 100 produced in accordance with the present invention exhibited measured Ft*BVceo values in the range of 365 GHz*V to approximately 400 GHz*V, which indicates a significant improvement over comparable conventional devices POR that provided measured Ft*BVceo values in the range of about 350 to 370 GHz*V. The greater Ft*BVceo value allows devices to operate at higher speeds while driving higher voltage or current swings.

The novel SIC implant process of the present invention facilitates the fabrication of larger HBTs having emitter structures having lengths/widths of 0.4 µm or greater such that these larger HBTs exhibit the enhanced performance characteristics of smaller HBTs (e.g., HBTs having lengths/widths less than 0.4 μm), and may be beneficially implemented in CMOS, BiCMOS and bipolar-only fabrication flows. Those skilled in the art understand that the emitter size of a given HBT is typically determined by the amount of load (power) applied across the HBT, where larger HBTs are typically utilized in higher power applications, and smaller HBTs may be utilized in lower power applications. It is also understood in the art that smaller HBTs fabricated using a given process flow have better performance characteristics (e.g., higher Ft*BVceo metrics and lower Kirk Effect) than larger HBTs fabricated using the same process flow. The present inventors recognized that the conventional fabrication approaches utilized to produce both larger and smaller HBTs involves utilizing an SIC implant mask having a single opening over each HBT's collector region, and believe that the smaller collector mask opening utilized to generate SIC regions in the smaller HBTs may account for the smaller HBTs' superior performance characteristics. That is, when HBTs are fabricated using conventional approaches, the SIC implant mask includes a single collector implant mask window (opening) that is scaled (i.e., is made larger or smaller) depending on the size of the emitter structure. The inventors believe the smaller SIC implant mask window utilized during the fabrication of smaller HBTs generates an increased mask edge effect that produces higher doping concentrations in the uppermost portions of the SIC regions, which in turn generates an enhanced base-collector junction that increases the Ft*BVceo metric and decreases the Kirk Effect in smaller HBTs. According to the present invention, larger HBTs are produced using the novel SIC implant process in which the SIC dopant is passed through two or more SIC mask openings into each larger HBT's collector region, thereby effectively mimicking the SIC implant process of a smaller HBT by way of utilizing multiple mask openings to intentionally increasing mask edge effects during the SIC implant process. Moreover, the multiple mask-opening approach of the present invention may be utilized to produce some smaller HBTs (e.g., by way of implementing openings having widths of 0.1 μm or less, provided two or more such openings may be implemented within the required HBT collector region), thereby facilitating the fabrication of smaller HBTs exhibiting increased Ft*BVceo metrics in comparison to comparably sized HBTs produced using conventional single-mask-opening methods.

The present invention also provides a low-cost advantage over conventional solutions for fabricating larger HBT in that it can be incorporated into existing HBT production flows with minimal changes to the process parameters. That is, the main change required by the present invention during the SIC implant process involves modifying the SIC implant mask (i.e., changing the SIC implant mask to include two or more smaller openings instead of a single larger opening). Once the SIC implant mask is formed, the SIC implant (doping) process may be performed using the same n-type or p-type implant process utilized to form the SIC region according to the existing HBT production flow. Moreover, after the SIC region is fabricated as described above, a base structure and an emitter structure may be subsequently formed over the SIC region using established processes of the existing HBT production flow. Accordingly, the present invention provides a simple design-enabled methodology for generating improved HBTs that exhibit improved operating characteristics by intentionally utilizing resist mask edge effects to enhance the base-collector junction without requiring expensive additional processing steps or complex process parameter changes to established HBT fabrication processes.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for manufacturing a heterojunction bipolar transistor, the method comprising:
    forming a semiconductor substrate having a first conductivity type with a buried layer region having a second conductivity type such that the buried layer region is separated from an upper surface of the semiconductor substrate by at least a portion of an intervening collector region of said semiconductor substrate;
    forming a selectively implanted collector (SIC) region having the second conductivity type in said collector region such that the SIC region extends from the upper surface of the semiconductor substrate to the buried layer region;
    forming a base structure having the first conductive type on the upper surface of the semiconductor substrate such that a portion of the base structure is disposed over the SIC region, thereby forming a base-collector junction of said heterojunction bipolar transistor between said base structure and said SIC region; and
    forming an emitter structure having the second conductive type such that a portion of the emitter structure contacts the base structure,
    wherein forming the SIC region includes:
    forming an SIC implant mask including depositing a photoresist layer on the upper surface of the semiconductor substrate, and patterning said photoresist layer such that the SIC implant mask defines a plurality of mask openings that expose corresponding upper surface sections of said upper surface that are located over the collector region, and
    directing dopant particles having the first conductive type toward the SIC implant mask such that first portions of said dopant particles pass directly through said plurality of mask openings and form one or more primary increased-doping regions in the collector region, and such that second portions of said dopant particles are subject to mask edge effects produced by side edges of the plurality of mask openings and form a plurality of secondary increased-doping regions in the collector region between the one or more primary increased-doping regions and the corresponding surface sections of the semiconductor substrate, whereby said secondary increased-doping regions enhance said base-collector junction.

2. The method according to claim 1, wherein patterning said photoresist layer comprises forming said plurality of mask openings such that each of the plurality of mask openings has a width in a range of 0.1 μm to 0.25 μm.

3. The method according to claim 2, wherein patterning said photoresist layer comprises forming said plurality of mask openings such that each of the plurality of mask openings has a width in a range of 0.1 μm to 0.12 μm.

4. The method according to claim 1,
    wherein the semiconductor substrate comprises a p-type conductivity, and forming the semiconductor substrate comprises forming the buried layer region by implanting a first n-type dopant into a corresponding portion of the semiconductor substrate,
wherein forming the SIC region comprises implanting a second n-type dopant into the collector region through said plurality of mask openings,
wherein forming the base structure comprises depositing a p-doped silicon layer on the surface of the semiconductor substrate over the SIC region,
wherein forming the emitter structure comprises depositing an n-doped silicon structure on an upper surface of the base structure.

5. The method according to claim 4, wherein forming the base structure comprises:
depositing a silicon-germanium (SiGe) layer on the surface of the semiconductor substrate; and
patterning the SiGe layer to form an intrinsic base structure over the collector region.

6. The method according to claim 1,
wherein the semiconductor substrate further comprises forming a plurality of spaced-apart parallel isolation structures that are at least partially exposed on the upper surface of the semiconductor substrate such that the collector region is disposed between first and second isolation structures of the plurality of spaced-apart parallel isolation structures, and such that an intervening collector contact region of the semiconductor substrate is disposed between the second isolation structure and a third isolation structure of the plurality of spaced-apart parallel isolation structures,
wherein the method further comprises forming a collector sinker in the collector contact region using a second implant mask having a single opening that exposes a portion of the upper surface over the collector contact region, and implanting a first n-type dopant into the collector contact region through the single opening, and
wherein forming the SIC region comprises implanting a second n-type dopant into the collector region using the SIC implant mask.

7. The method according to claim 1,
wherein forming the semiconductor substrate comprises forming said collector region in a rectangular-shaped region of said semiconductor substrate such that said collector region has a width extending in a widthwise direction between first and second elongated parallel isolation structures, and has a length extending in a lengthwise direction between third and fourth elongated isolation structures, and
wherein forming the SIC region comprises patterning said implant mask such that said plurality of mask openings are entirely located over said rectangular-shaped region.

8. The method according to claim 7, wherein patterning said implant mask comprises forming each said mask opening such that opposing side edges of each of said plurality of elongated openings extend parallel to the lengthwise direction, and such that opposing end edges are aligned in the widthwise direction.

9. The method according to claim 8, wherein forming said plurality of elongated openings comprises forming first and second elongated openings respectively disposed over corresponding centrally located portions of the rectangular-shaped region.

10. The method according to claim 7, wherein patterning said implant mask comprises forming said plurality of mask openings such that side edges of said plurality of mask openings are aligned in the lengthwise direction, and such that end edges of each said elongated opening extend parallel to the widthwise direction.

11. The method according to claim 10, wherein forming said plurality of mask openings comprises forming a plurality of elongated parallel openings that are aligned in a single column in the lengthwise direction.

12. The method according to claim 7, wherein forming said plurality of mask openings comprises arranging said mask openings in a plurality of rows and a plurality of columns, each said row being aligned in the widthwise direction, and each said column being aligned in the lengthwise direction.

* * * * *